United States Patent
Ishihara et al.

(10) Patent No.: US 9,224,600 B2
(45) Date of Patent: Dec. 29, 2015

(54) METHOD OF MANUFACTURING PART OF A THIN-FILM DEVICE USING AN INK COMPRISING A MATERIAL PRECURSOR

(75) Inventors: Ryoichi Ishihara, Delft (NL); Michiel Van Der Zwan, Delft (NL)

(73) Assignee: TECHNISCHE UNIVERSITEIT DELFT (NL)

( * ) Notice: Subject to any disclaimer, the term of this patent is extended or adjusted under 35 U.S.C. 154(b) by 0 days.

(21) Appl. No.: 14/343,733

(22) PCT Filed: Sep. 10, 2012

(86) PCT No.: PCT/EP2012/003795
§ 371 (c)(1),
(2), (4) Date: Jun. 10, 2014

(87) PCT Pub. No.: WO2013/034312
PCT Pub. Date: Mar. 14, 2013

(65) Prior Publication Data
US 2014/0370694 A1    Dec. 18, 2014

(30) Foreign Application Priority Data
Sep. 8, 2011    (NL) ...................................... 2007372

(51) Int. Cl.
*H01L 21/02* (2006.01)
*H01L 27/12* (2006.01)
*H01L 51/00* (2006.01)

(52) U.S. Cl.
CPC ...... *H01L 21/02592* (2013.01); *H01L 21/0243* (2013.01); *H01L 21/02422* (2013.01); *H01L 21/02425* (2013.01); *H01L 21/02532* (2013.01); *H01L 21/02554* (2013.01); *H01L 21/02565* (2013.01); *H01L 21/02601* (2013.01); *H01L 21/02614* (2013.01); *H01L 21/02628* (2013.01); *H01L 21/02642* (2013.01);
(Continued)

(58) Field of Classification Search
None
See application file for complete search history.

(56) References Cited

U.S. PATENT DOCUMENTS

| | | | |
|---|---|---|---|
| 4,854,230 A * | 8/1989 | Niki et al. | ..................... 101/123 |
| 5,607,099 A | 3/1997 | Yeh et al. | |
| 5,672,542 A | 9/1997 | Schwiebert et al. | |

(Continued)

FOREIGN PATENT DOCUMENTS

| | | |
|---|---|---|
| EP | 1087428 A1 | 3/2001 |
| WO | 03056641 A1 | 7/2003 |

(Continued)

OTHER PUBLICATIONS

International Search Report and Written Opinion of the International Searching Authority Application No. PCT/EP2012/003795 Completed: Jan. 30, 2013; Mailing Date: Feb. 6, 2013 12 pages.

*Primary Examiner* — Scott B Geyer
(74) *Attorney, Agent, or Firm* — St. Onge Steward Johnston and Reens, LLC

(57) ABSTRACT

A method for the manufacture of at least part of a thin-film device including forming one or more indentations in a substrate, preferably a plastic substrate, an indentation having sidewalls and a base; filling at least one of the one or more indentations with a first ink, the first ink having a first material precursor, preferably a first metal-, semiconductor-, or a metal-oxide precursor; and, annealing at least a portion of the first ink such that a surface of the base inside the indentation is dewetted and a narrowed first structure of the first material inside of the indentation is formed.

20 Claims, 7 Drawing Sheets

(52) U.S. Cl.
CPC ..... *H01L 21/02667* (2013.01); *H01L 27/1292* (2013.01); *H01L 51/0005* (2013.01)

(56) References Cited

U.S. PATENT DOCUMENTS

| | | |
|---|---|---|
| 6,861,365 B2 | 3/2005 | Taussig et al. |
| 2005/0168140 A1 | 8/2005 | Nakamura et al. |
| 2005/0170076 A1 | 8/2005 | Seki et al. |
| 2008/0303029 A1 | 12/2008 | Kawashima et al. |
| 2009/0085095 A1 | 4/2009 | Kamath et al. |
| 2009/0194763 A1 | 8/2009 | Mino et al. |

FOREIGN PATENT DOCUMENTS

| | | |
|---|---|---|
| WO | 2008132000 A1 | 11/2008 |
| WO | 2009027627 A1 | 3/2009 |
| WO | 2012063766 A1 | 5/2012 |

\* cited by examiner

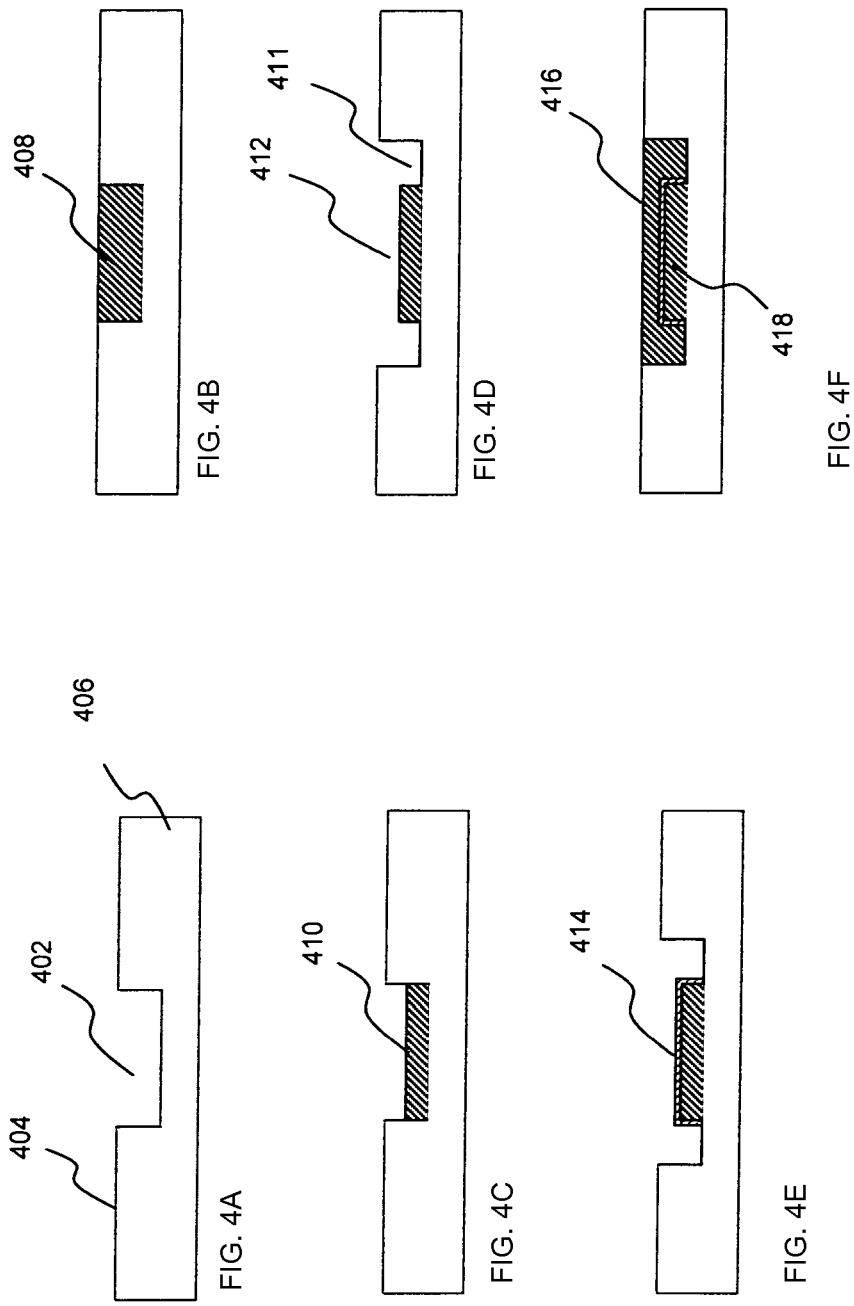

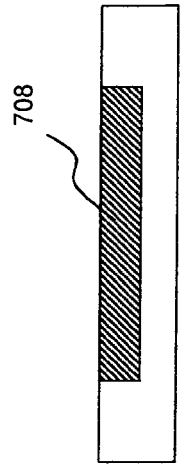
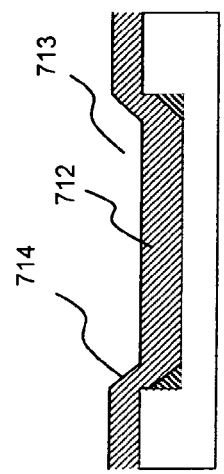
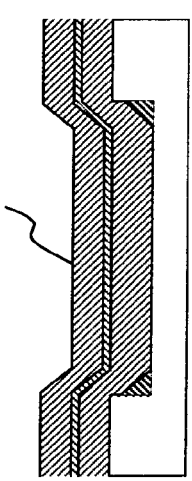
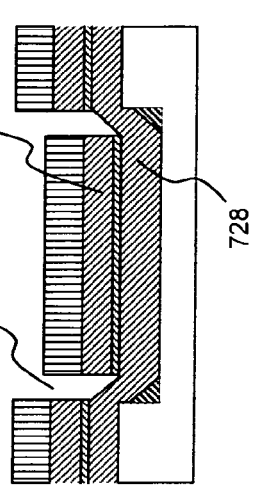
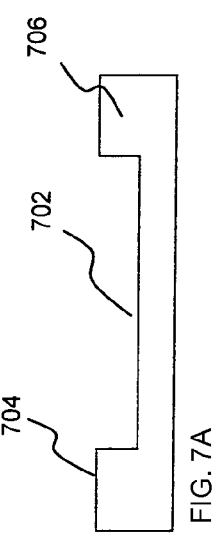
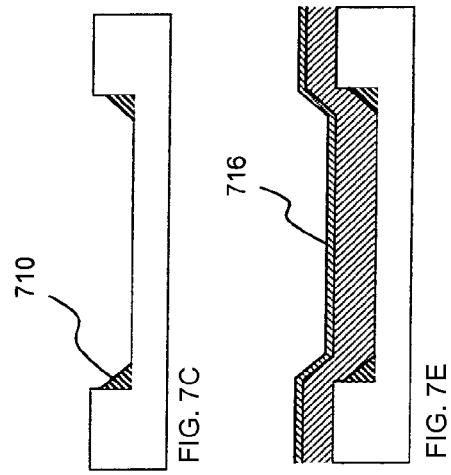
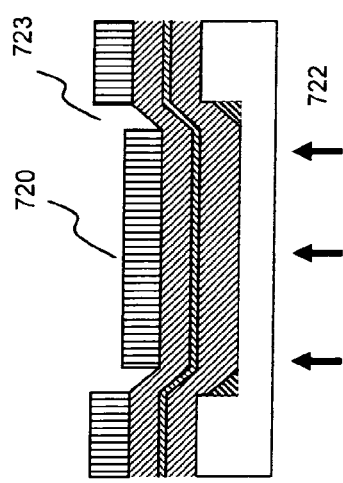

METHOD OF MANUFACTURING PART OF A THIN-FILM DEVICE USING AN INK COMPRISING A MATERIAL PRECURSOR

FIELD OF THE INVENTION

The present invention relates to a process for the manufacture at least part of a thin-film (semiconductor) device and a device manufactured according to such process.

BACKGROUND OF THE INVENTION

Semiconductor devices, such as diodes and transistors are essential components for electronic devices. A continuing demand exists for new, alternative, less expensive and/or improved manufacturing processes for their production.

Currently, a particular interest exists in processes for the production of flexible electronics components for use e.g. in RFID tags, flexible LED and LCD displays and photovoltaics. Flexible electronics are typically produced using so-called roll-to-roll (R2R) processing (also known as web processing or reel-to-reel processing). R2R processing refers to production methods wherein thin-films are deposited on a flexible (plastic) substrate and processed into electrical components in a continuous way.

In an R2R process preferably printing techniques (e.g. imprint, inkjet, or screen printing) and coating techniques (e.g. roll or spray coating) are used in order to achieve a high throughput, low-cost processing. Such techniques include the use of inks, i.e. liquid compositions, which can be deposited on the substrate using a simple coating or printing technique. This way flexible electronics can be fabricated at a fraction of the cost of traditional semiconductor manufacturing methods. R2R processing is however a technology which is still in development.

Problems that need to be overcome in order realize flexible electronics for high-performance applications, such as HF RFIDs and electronics for foldable phones, include the development of low-cost processes for the realization of thin-film structures with small feature size and high alignment accuracy and the development of ink-based processes for realizing high-mobility semiconducting thin-films on a flexible plastic substrate.

U.S. Pat. No. 6,861,365 B2 describes the realization of a three-dimensional resist structure on a thin-film semiconductor multi-layer stack on a flexible substrate. Subsequent (anisotropic) etching of the 3D mask allows the formation of thin-film semi-conducting structures in the multilayer stack. The minimum feature size and the alignment accuracy are determined by the 3D mask, which is further determined by the photolithography. The etching steps however are based on vacuum process thus providing a R2R process with an inefficient energy consumption and material usage. Moreover, although the 3D resist mask provides the required alignment, it introduces substantial design constrains and processing complexity.

EP 1 087 428 A1 describes a method for forming silicon film on the basis of silicon-containing ink. A solution containing a silane compound is applied onto a quartz substrate using ink-jet printing. After evaporation of the solvent, a silicon precursor film is formed that is subsequently transformed in silicon by an annealing step. The method however requires very high temperatures of up to 550° C. for converting the silane compound in the film into a crystalline silicon. Such high temperatures processing steps cannot be used in combination with flexible plastic substrates.

Hence, there is a need for in the art for improved methods for manufacture of thin-film structures on a flexible plastic substrate.

SUMMARY OF THE INVENTION

It is an object of the invention to reduce or eliminate at least one of the drawbacks known in the prior art. In a first aspect the invention may relate to a method for the manufacture of at least part of a thin-film device, wherein the method may comprise: forming one or more indentations in a substrate, preferably a plastic substrate, an indentation comprising sidewalls and a base; filling at least one of said one or more indentations with a first ink, said first ink comprising a first mate-material precursor, preferably a first metal-, semiconductor-, or a metal-oxide precursor; and, annealing at least a portion of said first ink such that a surface of said base inside the indentation is dewetted and a narrowed first structure of the first material inside of the indentation is formed. The invention allows for simple and cheap realization of narrow structures using the dewetting of an ink in an indentation.

In one embodiment said sidewalls may be configured to have a lower affinity for said ink than said surface of said base; or, wherein said surface of said base is configured a lower affinity for said ink than said sidewalls. The dewetting and thus the formation of the first structure inside the indentation may be controlled by the affinity of the sidewalls and base surface for the ink.

In one embodiment said affinity for said ink may be controlled by selection of the materials of the sidewall and the base; and/or wherein said affinity for said ink is controlled by a surface treatment, preferably a plasma treatment, of said sidewalls and said base; and/or wherein said affinity for said ink is controlled by adding a predetermined surfactant and/or a solvent to the ink for modify its wetting properties; and/or wherein said affinity for said ink is controlled by irradiating said ink with UV radiation.

In an embodiment said annealing may comprise: transforming said material precursor in said ink to an inorganic material, preferably an amorphous semiconducting material, by exposing said ink to microwaves, preferably the microwave power being selected from the range between 100 W and 10 kW, the microwave frequency within the range between 300 MHz and 300 Ghz; and/or by exposing said ink to a thermal annealing step wherein said ink is exposed to a temperature within a range between 50 and 350° C. Hence, the material precursor may be transformed into a (solid state) organic material, e.g. an amorphous material by a process with a relatively low processing temperatures thereby making the method suitable for the fabrication of electronic devices on plastic (polyamide) substrates, foils and/or sheets.

In another embodiment said annealing may comprise: exposing said inorganic solid-state material to a laser, preferably a pulsed laser, in order to transform at least part of said inorganic material in a crystalline material, preferably a crystalline semiconducting material. Hence, processing inks may allow the formation of a crystalline semiconducting materials which is desired when manufacturing high-mobility TFTs on flexible substrates.

In an embodiment said material precursor may comprise a semiconductor precursor comprising one or more silane compounds represented by the general formula $Si_nX_m$, wherein X is a hydrogen; n is preferably an integer of 5 or greater and is more preferably an integer between 5 and 20; m is preferably an integer of n, 2n−2, 2n or 2n+1. Silane compounds are especially suitable in the fabrication of high-mobility polycrystalline TFTs on flexible substrates.

In an embodiment said annealing may comprise: exposing said ink in said one or more indentations to UV radiation for a predetermined time such that at least part of said base surface within said indentation is dewetted.

In an embodiment the height of said one or more indentions is between 10 nm and 5000 nm, preferably between 20 nm and 2000 nm, more preferably between 40 nm and 1000 nm; and/or wherein said one or more indentation have a width between 40 nm and 5000 nm, preferably between 80 nm and 2000 nm, more preferably between 100 nm and 1000 nm.

In an embodiment, during said annealing at least a portion of said first ink, said first material precursor accumulates at edges of the bottom surface of the indentation to form first structures (filaments) while the centre part of the base surface in said indentation is dewetted, said method further comprising: transforming said first structures (filaments) into a solid state material, preferably a crystalline material.

In an embodiment, said method may further comprise: applying a second ink, said second ink comprising a second material precursor, preferably a second metal-, semiconductor-, or a metal-oxide precursor; over said substrate and at least one of said indentation comprising said first structures; forming a staggered first thin-film across said indentation by transforming said second material precursor into a solid-state second material, preferably a crystalline semiconductor material. Hence, thin-film stacks may be fabricated which are self-aligned.

In an embodiment, said method may comprise: forming an oxide layer over said staggered first thin-film; filling said indentation comprising said first structure and at least part of said staggered first thin-film with a third ink, said third ink comprising a third material precursor, preferably a third metal-, semiconductor-, or a metal-oxide precursor; annealing at least a portion of said third ink such that a second structure comprising a third material precursor is formed inside the indentation.

In an embodiment said substrate may be a transparent substrate and wherein said first structures (filaments) are used as a mask for selectively exposing a resist on top of said substrate when the backside of said substrate is exposed to UV radiation.

In an embodiment, during said annealing at least a portion of said first ink, said first material precursor may accumulates at the centre of the base surface of the indentation to form first structures while areas along the sidewalls of said indentation are dewetted In another embodiment, said method may further comprise: transforming said first structures into a solid state material, preferably a crystalline material; forming an oxide layer over said first structure; filling said indentation comprising said first structure with a second ink, said second ink comprising a second material precursor, preferably a third metal-, semiconductor-, or a metal-oxide precursor; annealing at least a portion of said second ink such that a second structure comprising a second material precursor is formed inside the indentation over said first structure.

In an embodiment said at least one of said one or more indentations may be used as a template in the formation of a second structure which is in alignment with said first structure.

In an embodiment said substrate is a flexible substrate, preferably a plastic substrate or a metal substrate.

In a further aspect, the invention relates to a thin-film device manufactured with the method according to any of the above-described method claims.

BRIEF DESCRIPTION OF THE DRAWINGS

FIG. 4A-F schematically depicts a process for the manufacture of at least part of a semiconducting device according to an embodiment of the invention;

FIG. 7A-7H schematically depicts a process for the manufacture at least part of a semiconducting device according to an embodiment of the invention.

DETAILED DESCRIPTION

Figure 1A:
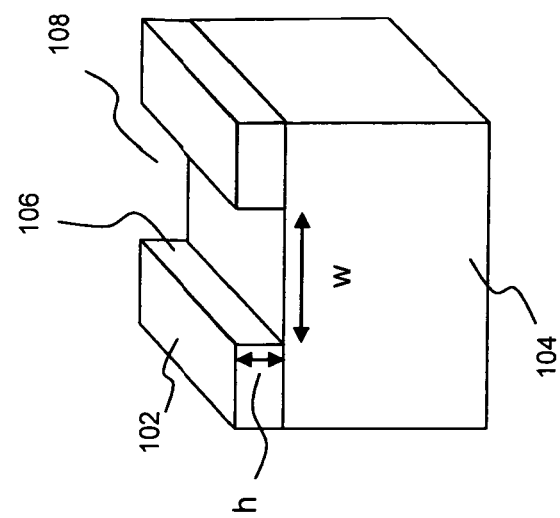
FIG. 1A-1C schematically depicts a process for forming a thin-film structure on a substrate according to an embodiment of the invention.
Figure 1B:
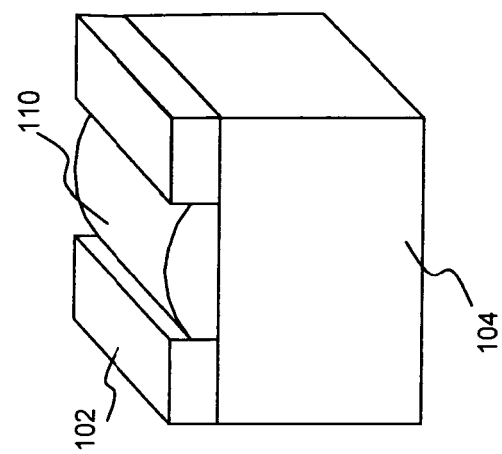
Figure 1C:
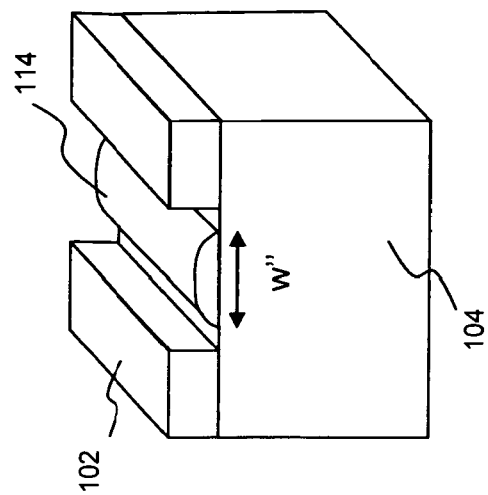

FIG. 1A-1C schematically depict process for forming at least part of a thin-film structure on a substrate according to an embodiment of the invention. As depicted in FIG. 1A, the process may start with the formation of one or more recessed regions (trenches or indentations), comprising sidewalls and a base (bottom surface), in the surface of a substrate 104. In one embodiment, patterning a thin-film sacrificial layer 102 on the surface of a substrate 104 may form a recessed region. The substrate may be a flexible (support) substrate comprising plastic and/or metal sheets or foils, e.g. polyimide, PEN, PPS), a fibre-reinforced resin composites and stainless steel sheets. Depending on the particular application, a substrate may further include on or more semiconducting and/or insulation layers.

In one embodiment, the patterned sacrificial layer may comprise one or more recessed regions defined by sidewalls formed by the patterned thin film sacrificial layer and a bottom surface formed by part of the surface of substrate. In that case, the sidewalls and base of the recess may be of different materials. In another embodiment, the patterned sacrificial layer may comprise one or more recessed regions formed by sidewalls and a bottom surface of the thin-film sacrificial layer.

The recessed regions may be formed by a known microimprint or nano-imprint technique. Such imprint technique allows formation of a pattern or recessed regions by mechanical deformation of an organic layer using a template (sometimes also referred to as an imprint mold). Suitable examples of materials from which the template can be made include metals and hard inorganic materials, e.g. ceramics and quartz. The use of such a template with dimensions of the order of microns is particularly advantageous because of its mechanical durability and reliability The pattern of a template may be transferred into the blanket layer so that recessed regions are formed in the sacrificial layer. In one embodiment, the recessed regions in the blanket layer may be opened in order to expose the surface of support substrate. The sacrificial layer may be an organic layer, e.g. an epoxy or an acrylate of poly-urethane resin or an inorganic layer, e.g. a silicon dioxide layer or a silicon nitride layer.

Similarly, the substrate may be covered with a dielectric layer, e.g. a silicon dioxide layer or a silicon nitride layer.

The sidewalls of the recessed regions may be substantially perpendicular sidewalls with respect to the surface of the support substrate is formed. In another embodiments, the sidewalls may be oriented under an angle with respect to the surface of the substrate.

In another embodiment, the recessed regions may be formed by a known printing technique, such as gravure printing or screen-printing. In that case a thin-film ink pattern is transferred from a patterned master to the support substrate. The ink may include a (curable) photo resist or a dielectric precursor. By drying the ink and, in certain cases, by sintering and/or cross-linking the molecules in the ink, formation of a patterned sacrificial layer comprising one or more recessed regions may be realized wherein a recessed region may be defined by one or more sidewalls and the surface of the support substrate.

The sacrificial layer may be patterned to have at least two opposite sidewalls 106 extending longitudinally over the support substrate thereby forming a substantially rectangular-shaped, recessed region 108 (which hereafter may be referred in short as a recess, a trench or an indentation). In an embodiment, the height of the recessed region may be determined by the thickness of the patterned sacrificial layer. In the present disclosure, the recess may have a height selected from a range of about 10 nm to about 5000 nm, preferably about 20 nm to about 2000 nm, more preferably 40 nm to about 1000 nm. Further, the recess may be have a width from about 40 nm to about 5000 nm, preferably about 80 nm to about 2000 nm, more preferably about 100 nm to about 1000 nm. In certain embodiments, the recess (trench) in the support substrate may form a reservoir for receiving an ink composition.

FIG. 1B schematically depicts a recess filled with an ink composition (or in short an ink). A thick layer of ink may be applied to the surface of the patterned sacrificial layer. Various types of ink may be used. The ink may comprise a semiconductor-, a metal oxide semiconductor-, or metal precursor and, optionally, a solvent. In another embodiment, the ink may comprise a liquid organic semiconducting material. A doctor blade may be used to sweep over the surface of the patterned sacrificial layer so that the recessed regions may be filled, or at least partially filled, with the ink 110 and excess ink is removed.

In one embodiment, an ink composition comprising a semiconductor precursor, preferably a group IV semiconductor precursor, and, optionally, a solvent may be used. The solvent may be used to control the viscosity and/or the wetting properties of the ink. The ink may be used to form a thin-film (structure) in a recess.

In an embodiment, the semiconductor precursor may comprise one or more silane compounds represented by the general formula $Si_nX_m$, wherein X is a hydrogen; n is preferably an integer of 5 or greater and is more preferably an integer between 5 and 20; m is preferably an integer of n, 2n−2, 2n or 2n+1; wherein part of the hydrogen may be replace by a halogen.

Examples of such silane compounds are described in detail in EP1087428, which is hereby incorporated by reference into this application. Examples of the compounds of m=2n+2 include silane hydrides, such as trisilane, tetrasilane, pentasilane, hexasilane, and heptasilane, and substituted compounds thereof in which hydrogen atoms are partially or completely replaced with halogen atoms. Examples of m=2n include monocyclic silicon hydride compounds, such as cyclotrisilane, cyclotetrasilane, cyclopentasilane, silylcyclopentasilane, cyclohexasilane, silylcyclohexasilane, and cycloheptasilane; and halogenated cyclic silicon compounds thereof in which hydrogen atoms are partially or completely replaced with halogen atoms, such as hexachlorocyclotrisilane, trichlorocyclotrisilane, coctachlorocyclotetrasilane, tetrachlorocyclotetrasilane, decachlorocyclopentasilane, pentachlorocyclopentasilane, dodecachlorocyclohexasilane, hexachlorocyclohexasilane, tetradecachlorocycloheptasilane, heptachlorocycloheptasilane, hexabromocyclotrisilane, tribromocyclotrisilane, pentabromocyclotrisilane, tetrabromocyclotrisilane, octabromocyclotetrasilane, tetrabromocyclotetrasilane, decabromocyclopentasilane, pentabromocyclopentasilane, dodecabromocyclohexasilane, hexabromocyclohexasilane, tetradecabromocycloheptasilane, and heptabromocycloheptasilane. Examples of compounds of m=2n−2 include dicyclic silicon hydride compounds, such as 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, and spiro[6,6]tridecasilane; substituted silicon compounds in which hydrogen atoms are partly or completely replaced with SiH3 groups or halogen atoms. Moreover, examples of compounds of m=n include polycyclic silicon hydride compounds, such as Compounds 1 to 5 represented by the following formulae, arid substituted silicon compounds thereof in which hydrogen atoms are partially or completely replaced with SiH3 groups or halogen atoms. These compounds may be used as a mixture of two or more types.

In preferred embodiments, the semiconductor precursor may comprise cyclopentasilan (CPS) $Si_5H_{10}$ and/or cyclohexasilane (CHS) $Si_6H_{12}$. An ink comprising one or more silane compounds may be used without a solvent, e.g. pure liquid CPS, or with a solvent. When using a silane compound such as CPS as an ink without an additional solvent, the silane compound may be exposed to UV such that part of the silane compound molecules are transformed into polysilane. A UV exposed silane compound is more viscous. Adding a solvent to the UV exposed silane compound may increase the wetting.

The above-mentioned (hydrogenated) silane compounds provide the advantage that it can be readily converted into a semiconductor by simple and well-known processes such as annealing step in order to form (low hydrogen) amorphous Si (a-Si) and (pulsed) laser crystallisation or an temperature annealing step in order in order to transform the amorphous silicon into (poly)crystalline silicon. Moreover, such silane compounds can be used in printing techniques.

Alternatively and/or in addition, an ink may comprise semiconducting nano-particles, preferably of the group IV semiconductors, e.g., Si nano-particle dispersed solution.

In another embodiment, an ink comprising a dielectric precursor and a solvent may be used. On the basis of such ink a dielectric layer or structure may be formed in a recess. For example, in an embodiment a dielectric precursor such as fluorosilicic acid ($H_2SiF_6$) may be used in a well-known liquid-phase deposition step in order to form a dielectric layer such as $SiO_2$. Alternatively Tetraethyl orthosilicate (TEOS) or di-methylsufone-oxide (DMSO) may be used as a precursor in the formation of a $SiO_2$ layer. In another embodiment, metal-based silicic acid/boric acid mixtures may be used in a well-known liquid-phase deposition step in order to form a metal oxide layer such as $TiO_2$, $ZrO_2$, $HfO_2$, etc.

In yet another embodiment, an ink comprising metal precursor and, optionally, a solvent may be used. On the basis of such ink a metal or metallic (e.g. a silicide) layer or structure may be formed. In one embodiment the metal precursor may comprise metal nano particles (e.g. Al,Ni,Pd,Pt,Mo,Wi,Ti, Co, etc.) or organometallic compounds.

Examples of suitable solvents for using in an ink composition include: hydrocarbon solvents such as n-hexane, n-heptane, n-octane, n-decane, dicyclopentane, benzene, toluene, xylene, durene, indene, tetrahydronaphthalene, decahydronaphthalene, and squarane; ether solvents such as dipropyl ether, ethylene glycol, dimethyl ether, ethylene glycol dimethyl ether, ethylene glycol diethyl ether, diethylene glycol dimethyl ether, diethylene glycol diethyl ether, diethylene glycol methyl ethyl ether, tetrahydrofuran, tetrahydropyran, 1,2-dimethoxyethane, bis(2-methoxyethyl)ether, and p-dioxane; and polar solvents such as propylene carbonate, gamma-butyrolacetone, N-methyl-2-pyrrolidone, dimethylformamide, acetonitrile, dimethyl sulfoxide, and cyclohexanone.

In further embodiments, toluene or cyclooctane may be used as a solvent.

The solvent is selected such that it does not react with the precursor during processing. Moreover, its vapour pressure should be between 0.001 mmHg and 200 mmHg. A pressure lower than 0.001 mmHg would evaporate the solvent too slow increasing the risk of the solvent remaining in the final layer which would decrease the quality of the properties of the film, e.g. the quality of the silicon film in case of a silane compound silicon precursor is used.

An additive such as a surfactant may be additionally added to the ink composition in order to modify its wetting properties in a recess. The surfactant may be a fluorine type, a silicon type, or a nonionic type, in a trace amount, if necessary, within a range which does not impair required functions. The nonionic surfactant improves wettability for applying the solution and leveling of the coating film, and prevents graininess and an orange peel surface of the coating film.

The ink composition may comprise at least 20 weight percent solvent, at least 40 weight percent or at least 60 weight percent solvent. Hence, as the solvent in the ink is evaporating, the volume of the ink decreases and the drying ink volume (comprising a polymeric semiconductor, metal or dielectric precursor) may be collected in areas of the recess region in accordance with the wetting behaviour of the ink.

Wetting is the ability of a liquid to maintain contact with a solid surface so that a liquid spreads out over a substrate surface. Wetting results from intermolecular interactions between the substrate and the liquid when the two are brought together. A force balance between adhesive and cohesive forces determines the degree of wetting (wettability). Dewetting is the opposite of wetting. In that case, a liquid tries to minimize its contact surface with the substrate surface.

The contact angle θ is the angle at which the liquid-vapour interface meets the solid-liquid interface. For a simple substrate-liquid system, the well-known Young formula $\gamma_S = \gamma_{SL} + \gamma_L \cos\theta$ provides the relation between contact angle (θ) and the surface energy of the substrate $\gamma_S$, the surface energy of the liquid $\gamma_L$ and the substrate-liquid interface $Y_{LS}$ respectively. A surface is more wettable when the surface energy of the liquid $\gamma_L$ is low and θ is low.

The surface energy—and thus the contact angle—may depend on various parameters and/or processing conditions such as temperature, substrate material, substrate surface treatment, the precursor/solvent ratio in the ink. A substrate material may have a high affinity for a liquid. In that case a liquid may spread over (wet) the substrate surface. Such materials are referred to as hydrophilic (in case of water-based liquids) or lyphofilic. Similarly, a substrate material may have a low affinity for a liquid. In that case a liquid may form a spherical cap on the substrate with contact angle θ. Such materials are referred to as hydrophobic (or lyphofobic). The (de)wetting behavior of the ink on the surface of the patterned substrate, including the recesses, is governed by these parameters.

In the embodiment depicted in FIG. 1A-1C, the material of the sacrificial layer and the substrate are configured such that the sidewall surfaces in a recess are more hydrophobic than the base surface (bottom surface) of recess. For example, in one embodiment, the material of the sacrificial layer forming the sidewalls maybe be selected (and/or treated) such that is the sidewall surfaces are more hydrophobic than the material forming the base surface (e.g. the substrate surface). Therefore, the contact angle of the ink with the sidewalls of the recess is relatively large as schematically depicted in FIG. 1B.

For a liquid semiconductor precursor such as cyclopentasilan (CPS), the contact angle may vary depending on the surface substrate material between 10° and 35°. For example, contact angle of around 33.4° was measured when using $Si_2N_3$ as a surface substrate material at room temperature. Lower contact angles between about 12° and 18° were measured when using thermal oxide or TEOS as a surface substrate material.

Surface modification techniques may be used to increase of decrease the contact angle of CPS. For example, in an embodiment, a short HF dip (0.55% HF for 4 minutes) may be used to increase wetting properties by a decrease in the contact angle of a few degrees. In another embodiment, the hydrophobic properties of the materials forming the recess may be control be exposing the recess to $CF_4/O_2$ plasma as described in US2005/0170076.

In a further embodiment, the substrate temperature may be used for controlling the wetting in a recess. This may be used in combination with any of above-mentioned surface treatments. For example, the wettability of the substrate surface by CPS may be increased by increasing the substrate temperature, especially when combined with a short HF etch (HF dip). For example, a contact angle of about 5° was measured for TEOS at a substrate temperature of around 75° C.

FIG. 1C depicts a dried ink structure in a recessed region after evaporation of the solvent in the ink. During evaporating of the solvent, the total volume of the ink decreases from a first volume to a second smaller volume. As the sidewalls are more hydrophobic than the bottom surface, the ink will have a tendency to stay away from the sidewalls so that at least a substantial part of the drying ink will be concentrated at the centre of the recessed region away from the sidewalls. This way at least part of the areas along the sidewalls will be dewetted. The dried ink comprising the semiconductor, metal or dielectric precursor may be subsequently processed and transformed into a semiconductor, metal or insulator respectively wherein remnants of materials close to the recess may be removed using a suitable removal step.

Hence, on the basis of the process depicted in FIG. 1A-1C, a thin-film structure with reduced dimensions (i.e. dimensions smaller than the width of the recess) may be formed in the recess. The process results in a first narrowed, thin-film structure inside the recess, so that the recess can serve as a template in the formation of a further second thin-film structure, which may be accurately aligned with respect to first thin-film structure. This way both small feature size and high alignment accuracy can be achieved. Although FIG. 1C depicts the formation of a longitudinal thin-film structure, it is clear for a skilled person that the invention allows formation of may shapes of ink filaments, e.g. (partly) rectangular, circular, triangular or combinations thereof.

FIG. 2A-2H depicts a schematic of a process for the manufacture of a thin-film structure according to an embodiment of the invention. The process may be used in a process for the manufacture of a thin-film transistor (TFT) and/or may be part of a roll-to-roll process involving a layer transfer process.

Figure 2A:
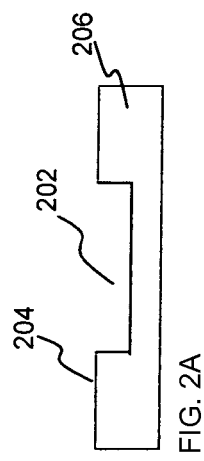
FIG. 2A-H schematically depicts a process for the manufacture of at least part of a semiconducting device according to an embodiment of the invention.

FIG. 2A depicts the start of the process wherein a first (support) substrate is provided and one or more indentations (recesses) 202, each comprising sidewalls and a base (bottom surface), are formed in the top surface 204 of the first substrate 206. The one or more indentations are formed such that the sidewalls of the indentations are more hydrophobic than the bottom surface of the indentation in a similar way as described with reference to FIGS. 1A and 1B.

Figure 2B:
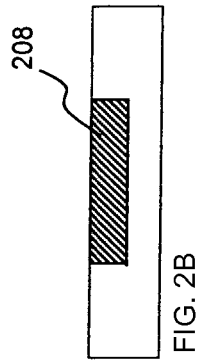

FIG. 2B depicts an indentation filled with a first liquid material 208, preferably a first semiconducting material, e.g. a semiconducting ink composition comprising a semiconductor precursor and an (organic) solvent as described with reference to FIG. 1B. In one embodiment, the semiconducting ink composition may comprise a silane compound represented by the general formulae $Si_nX_m$.

In an embodiment (not shown), a known slit coating technique (doctor blade) may be used for filling the indentation wherein the first liquid semiconducting material is provided on the substrate comprising the indentations. After sweeping the surface of the substrate with a blade, excess material is removed and the indentations are filled with the first liquid semiconducting material. In another embodiment, an ink-jet printing method may be used in order to fill the indentation.

Figure 2C:
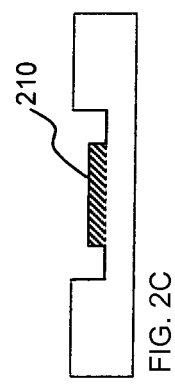

Thereafter, the solvent in the ink composition may be evaporated so that the total volume of the ink composition in the indentation is reduced. Due to the hydrophobic properties of the sidewalls and the bottom surface of the indentation areas of the bottom surface along the sidewalls are dewetted during evaporation of the solvent so that a narrowed first thin-film structure 210 is formed in the centre of the indentation as depicted in FIG. 2C. The first thin-film structure may be transformed to into a solid-state semiconducting thin-film using a suitable transformation process.

In case of a first liquid semiconducting material comprising a silane compound represented by the general formula $Si_nXm$, the evaporation of the solvent and the transformation of the silane compound into amorphous silicon may be achieved in a microwave-annealing step. The microwave-annealing step will heat up the ink composition so that the solvent is evaporated and dewetting at the bottom surface along the sidewalls occurs so that a narrowed first thin-film structure 210 is formed in the centre of the indentation as depicted in FIG. 2C.

Moreover, the silane monomers may form dipoles that will absorb the microwave radiation. The absorbed energy may break the Si—H bondings so that the hydrogen is released. Si—Si bondings will be formed resulting in a stable a-Si film with a low concentration of hydrogen (typically between 5-10%). The microwave-annealing step allows the overall temperature of the substrate to stay below 250° C. Such processing step is therefore particularly advantageous when processing materials on plastic substrates, which require low temperature processing (typically below 300° C.).

In order to achieve the transformation of the silane compound, the ink composition may be exposed to a microwave-annealing step with the microwave power selected from the range between 100 W and 10 kW and a microwave frequency within the range between 300 MHz and 300 Ghz. The exposure time may depend on the particular settings of the power and the frequency but will generally within a range between 10 s and 10 hours, preferably 20 s and 5 hours, more preferably 40 s and 2.5 hours. In some embodiment, the microwave-annealing step may be combined with a heating step wherein the first substrate is heated to a temperature with the range between 50 and 250° C.

In an other embodiment, instead of a microwave annealing step, the first liquid semiconducting material dewetting and transformation of the semiconducting material may be performed on the basis of a temperature anneal, including a first temperature annealing step in a first temperature range between 50° C. and 250° C. wherein the solvent is evaporated and dewetting at the bottom surface along the sidewalls occurs so that a narrowed first thin-film structure is formed in the centre of the indentation and a subsequent second thermal annealing step in a temperature range between 300° C. and 400° C., preferably below 350° C. using e.g. a hot plate. In some embodiment, the second thermal anneal may be combined with a microwave annealing step in order to reduce the thermal annealing temperature to a temperature below 350° C.

Thereafter, the a-Si thin-film structure may be exposed to a pulsed laser, e.g. an XeCl exacimer laser (308 nm, 250 ns) for the transformation of the a-Si into crystalline silicon (not shown). Remnants of silicon along the sidewalls of the recess may be removed using a suitable removal step, e.g. a short HF etch (an HF dip). Such HF etch may also be used to further reduce the dimensions of the thin-film layer.

Figure 2D:
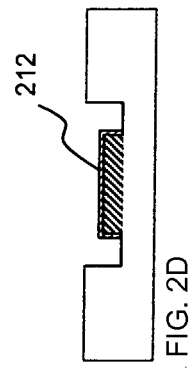

In this way a first thin-film (poly)crystalline semi-conducting structure may be formed in the indentation, wherein the width of the thin-film polycrystalline structure is smaller than the width of the indentation. Thereafter, an insulting layer may be formed over the first thin-film polycrystalline structure by oxidizing the its surface using e.g. an O2 plasma exposure thereby forming an $SiO_2$ insulating layer 212 as depicted in FIG. 2D.

The thus formed thin-film structure in the indentation may be used as a template for forming a further thin-film layer. To that end, the indentation, comprising a thin-film (poly) crystalline semiconducting structure 210, may be filled with a second liquid semiconducting material 214 (FIG. 2E), e.g. a semiconducting ink composition comprising a (organic) solvent as described with reference to FIGS. 1B and 2B. For example, in one embodiment, the semiconducting ink composition may comprise a silane compound represented by the general formula $Si_nX_m$, which is similar to the ink used for filling the indentation for forming the first thin-film structure.

In one embodiment, before filling the indentation, the surface within the indentation may be exposed to a surface and/or temperature treatment in order to increase the wetting of the surface within the indentation so that coverage by the second liquid material is achieved. Alternatively and/or in addition, a surfactant may be added to the second liquid semi-conducting material in order to increase the wetting within the indentation by the second liquid semiconducting material.

After filling the indentation, evaporation of the solvent in the second liquid semiconducting material comprising a silane compound represented by the general formula $Si_nX_m$ and the transformation of the silane compound into amorphous silicon may be achieved in a microwave-annealing step as described with reference to FIG. 2C. In this case an ink composition having a decreased weight percent solvent, e.g. substantially smaller than 20 weight percent. Alternatively, an ink composition comprising no solvent, such as pure (UV exposed) CPS may be used in order to eliminate, or at least substantially reduce, the effect of the volume decrease in this particular case.

Figure 2E:
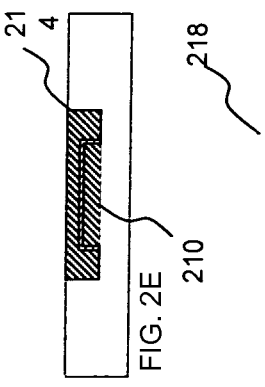
Figure 2F:
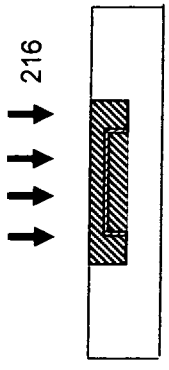
Figure 2G:
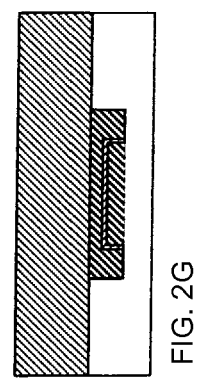

After the aligned formation of the second a-Si thin-film layer on top of the oxidized first thin-film (poly) crystalline layer, it may be exposed to a (pulsed) laser 216 similar to the described with reference to FIG. 2C in order to transform the a-Si into crystalline silicon (FIG. 2F). After completion of the thin-film TFT stack, it may be transferred to a second substrate 218 by bonding the top-surface of the substrate 220 comprising the thin-film crystalline silicon stack to the plastic substrate (FIG. 2G). Thereafter, the first substrate may be removed, e.g. etched away, so that a thin-film (poly) crystalline silicon stack, is formed on the second substrate. Here, the second substrate material may be plastic. Alternatively, the second substrate material may be stainless steel, glass, a polymer or a combination thereof.

Figure 2H:
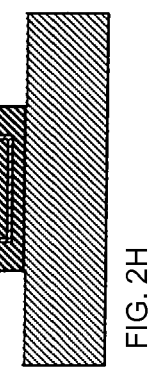

The resulting structure depicted in FIG. 2H may be part of a top-gate TFT stack comprising a polysilicon channel layer and a self-aligned polysilicon top gate. The channel layer may be connected to source and drain regions, which may be formed in a self-aligned manner by depositing dopant sources using an oxide coating diffusion (OCD) source. Dopants may be diffused into the silicon using a (pulsed) laser anneal. After removal of the OCD, metal electrodes may be printed using a silver-ink in order to enable electrical contact to the source and drain of the TFT.

Hence, process depicted in FIG. 2A-2H illustrates—in short—a process for forming a semiconductor structure, comprising the steps of:
- providing a substrate, preferably a polymeric substrate;
- providing an indentation in the substrate, preferably said indentation comprising sidewalls and a base;
- filling said indentation with an first ink comprising a first precursor material and, optionally, a solvent;
- annealing at least a portion of the ink such that a surface of said base inside the indentation is dewetted and a narrowed and thinned first structure of said first material inside of the indentation is formed;
- transforming said first precursor material in the first structure into a solid-state inorganic material by irradiating at least a portion of the first structure using microwaves or by a heating said at least a portion of the first structure to a predetermined temperature;
- crystallizing the first material of the first structure, preferably using a (pulsed) laser annealing step.

The thus obtained substrate comprising the indentation with the first structure may be used as a template for forming a self-aligned thin-film stack. Forming such thin-film stack may comprise the steps of:
- providing an insulating layer at a surface of the first structure, preferably by oxidising the annealed first material;
- filling said indentation with a second ink, wherein said second ink comprises a second precursor material;
- annealing at least a portion of said second ink so as to at least partially dry the second material to form a second structure;
- crystallizing the second material of the second structure, preferably using a (pulsed) laser annealing step.

In an embodiment, the thin-film stack may be transferred (or bonded to) another substrate, e.g. a plastic sheet, using the steps of:
- transferring the substrate comprising the indentation and the first and second structure in said in indentation onto a layer, preferably a plastic, stainless steel or a glass layer.
- removing the substrate.

On the basis of this process semiconducting structures, in particular TFT structures may be fabricated on a plastic substrate using low-temperature liquid-based process steps, which are compatible with R2R processing. The process allows the formation of self-aligned thin-film multi-layer structures without the need of complex mask structures and/or expensive vacuum equipment. Further, using the wetting FIG. 3 depicts a schematic of a process for the manufacture of a thin-film structure according to an embodiment of the invention. In this particular embodiment, the thin-film structure may be a part of a top gate thin-film transistor. Further, the process may be part of a roll-to-roll process.

Figure 3A:
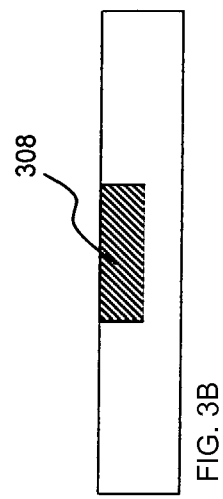
FIG. 3A-F schematically depicts a process for the manufacture of at least part of a semiconducting device according to an embodiment of the invention.
Figure 3B:
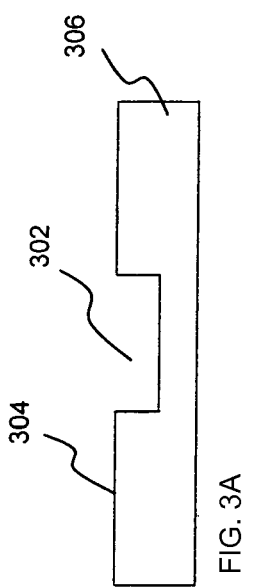

The process may start with providing a first (support) substrate and forming one or more indentations (a recess) 302, each comprising sidewalls and a bottom surface in the top surface 304 of the first substrate 306 as depicted in FIG. 3A. The one or more indentations may be formed such that the sidewalls of the indentations are more hydrophobic than the bottom surface of the indentation.

Before filling the indentation with a first liquid semiconducting material 308 comprising a silane compound represented by the general formula $Si_nX_m$ (FIG. 3B), the base of the indentation may be exposed to a surface and/or temperature treatment (e.g. an HF dip in combination with a temperature increase of the substrate as described with reference to FIG. 1B) in order to achieve full wetting of the base of the indentation by the liquid semiconducting material during the filling process and during the subsequent evaporation of the solvent in the liquid semiconducting liquid.

Figure 3C:
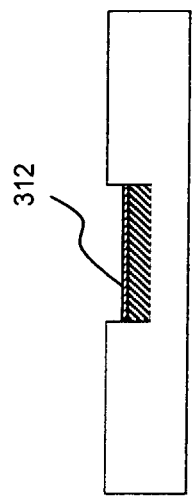
Figure 3D:
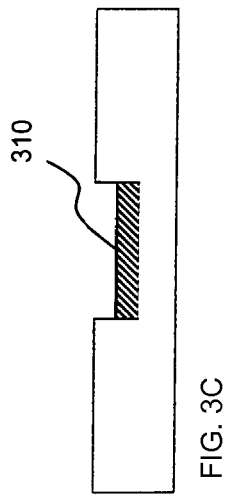
Figure 3E:
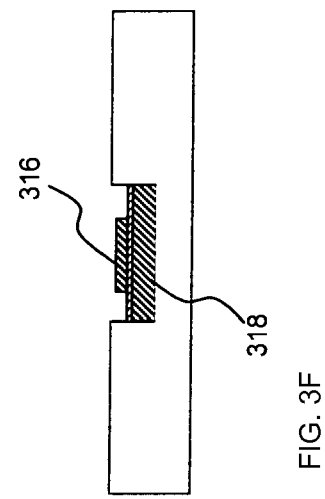
Figure 3F:
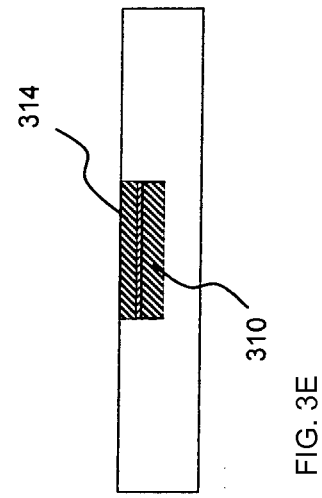

Slow evaporation of the liquid may be achieved by slightly heating the substrate to a temperature between 50 and 80° C. This way a thin-film polymeric semiconducting layer layer 310 may be formed on the base of the indentation as shown in FIG. 3C. The polymeric semiconducting layer may be transformed into a-Si and subsequently (poly)crystalline Si using the microwave and (pulsed) laser annealing steps and a silicon oxide layer 312 may be formed on the surface of the (poly) crystalline layer using the same processes as described with reference to FIGS. 2C and 2D respectively. The indentation with the (poly) crystalline thin-film at its base may be used as a template for a subsequent thin-film formation step.

The indentation comprising the (poly)crystalline thin film layer may be filled with a second liquid semiconducting material 314 comprising a silane compound represented by the general formula $Si_nX_m$ (FIG. 3E) and processed to a narrowed, second (poly)crystalline thin-film 316 using similar process steps as described with reference to FIG. 2A-2C. Also in this embodiment, the recess comprising sidewalls and—in this case—a silicon dioxide base surface may be exposed to an $CF_4/O_2$ plasma such that the hydrophobic properties of the materials forming the recess may be controlled. In this embodiment, on the basis of the known surface treatments, the sidewalls may be configured to be more hydrophobic than the silicon dioxide base surface so that during the microwave anneal dewetting of the silicon dioxide base surface occurs.

Hence, process depicted in FIG. 3A-3F illustrates—in short—a process for forming a semiconductor structure, comprising the steps of:
- providing a substrate, preferably a polymeric substrate;
- providing an indentation in the substrate, preferably said indentation comprising sidewalls and a base;
- filling said indentation with an first ink comprising a first (semiconducting) material;
- annealing at least a portion of said first ink in order to form a first layer of said first material in said indentation without dewetting the base of the indentation;
- annealing the first material, preferably using a (pulsed) laser to form a first layer of solid-state (semiconducting);

forming an insulating layer on at least a portion of a surface of the first layer, preferably by oxidising said first material;

filling said indentation with a second ink, wherein said second ink comprises a second (semiconducting) material and a solvent;

annealing at least a portion of said second ink such that a surface of said base inside the indentation is dewetted so that a narrowed and thinned first structure of the first material inside of the indentation is formed.

Hence, in this embodiment, a stack of thin-film (poly) crystalline films may be formed in a self-aligned manner. The stack may comprise a gate layer 316 and a channel layer 318, which can be used as a base structure for forming TFTs on a flexible substrate. Source and drain areas and electrodes for contacting the source and drain may be realized in a similar way as described in FIG. 2H.

FIG. 4A-4F depicts a schematic of a process for the manufacture of a thin-film structure according to an embodiment of the invention. In this particular embodiment, the semiconductor thin-film structure may be part of a top gate thin-film transistor. The process may start in a similar way was described with reference to FIG. 3A-3C.

FIG. 4A depicts the formation of one or more indentations (a recess) 402 in the top surface 404 of the first substrate 406, wherein each indentation comprises sidewalls and a bottom surface (base) as depicted in FIG. 3A. The one or more indentations may be formed such that the sidewalls of the indentations (and the top surface of the substrate) are more hydrophobic than the bottom surface (base) of the indentation.

FIG. 4B depicts the filling the liquid semiconducting material 408 a silane compound represented by the general formula $Si_nX_m$. In order to achieve full wetting of the base of the indentation by the liquid semiconducting material during the filling process and during the subsequent evaporation of the solvent in the semiconducting liquid, the base of the indentation may be exposed to a surface and/or temperature treatment (e.g. an HF dip in combination with a temperature increase of the substrate as described with reference to FIG. 1B).

FIG. 4C depicts the formation of a partially dried thin-film polymeric silane compound layer in the indentation. In this case, slow evaporation of the liquid may be achieved by slightly heating the substrate to a temperature between 50 and 200° C. This way, a partially dried thin-film polymeric semiconducting layer 410 may be formed on the base of the indentation as shown in FIG. 4C. Thereafter, the partially dried polymeric semiconducting layer may be transformed into a-Si using a microwave-annealing step.

This way, a semiconducting thin-film structure 412, preferably an amorphous silicon thin-film structure, is formed in the indentation. A subsequent (pulsed) laser annealing step may transform the semiconducting material into a (poly) crystalline semiconducting material.

Thereafter, an etching step, e.g. a dry or wet etch, may be used in order to etch the faces of the indentation such that it is widened and such that the semiconducting thin-film layer positioned at the centre of the widened indentation as depicted in FIG. 4D.

The thus formed indentation comprising the (poly) crystalline semiconducting structure may be used as a template for forming a stack of thin-film layers in the indentation. An insulting layer may be formed over the first thin-film polycrystalline structure by oxidizing the its surface using e.g. an O2 plasma exposure thereby forming an SiO$_2$ insulating layer 414 as depicted in FIG. 4E.

FIG. 4F depicts the formation of a further (semiconducting) layer 416 in the indentation on top of the oxidized (poly) crystalling layer on the basis of similar steps as described with reference to FIGS. 2E and 2F.

Hence, in this embodiment, a stack of thin-film (poly) crystalline films may be formed in a self-aligned manner. The stack may comprise a gate layer 418 and a channel layer 416, which can be used as a base structure for forming TFTs on a flexible substrate. This base structure may be transferred to a plastic substrate in a similar way as described with reference to FIGS. 2G and 2H.

Figure 5C:
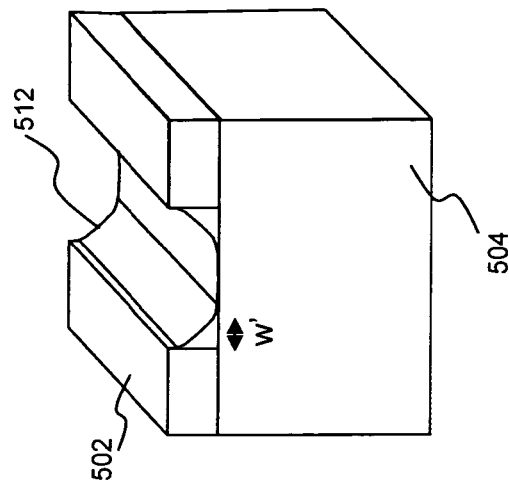
FIG. 5A-5C schematically depicts process for forming a thin-film structure on a substrate according to an embodiment of the invention.
Figure 5B:
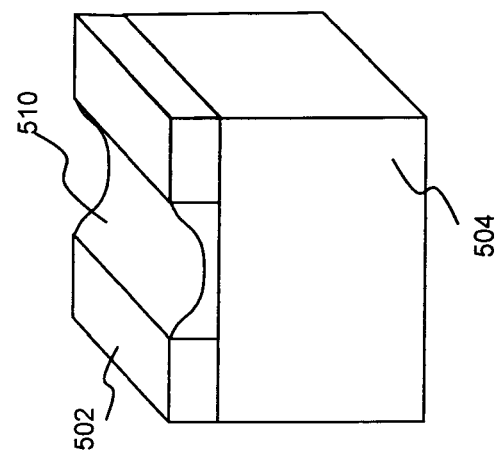
Figure 5A:
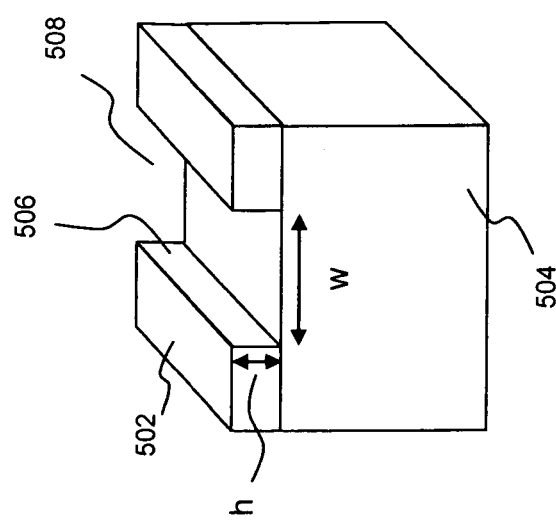

FIGS. 5A-5C schematically depict process for forming at least part of a thin-film structure on a substrate according to an embodiment of the invention.

In the embodiment depicted in FIG. 5A-5C, the material of the sacrificial layer and the substrate are configured such that the sidewall surfaces are less hydrophobic (hydrophilic) than the base surface (bottom surface). For example, in one embodiment, the material of the sacrificial layer forming the sidewalls may be selected (and/or treated) such that is the sidewall surfaces are less hydrophobic (hydrophilic) than the material forming the base surface (e.g. the substrate surface). Therefore, the contact angle of the ink with the sidewalls of the recess is relatively small as schematically depicted in FIG. 5B.

FIG. 5A depicts the start of a process wherein one or more recessed regions (trenches or indentations), comprising sidewalls and a base (bottom surface), are formed in the surface of a substrate 504 in as similar way as described with reference to FIG. 1A. In one embodiment, a thin-film sacrificial layer 502 on the (top) surface of a substrate 504 may be patterned in order to form a recessed region 508. The substrate may be a flexible (support) substrate comprising a plastic sheet (e.g. polyimide) or a metal foil (e.g. stainless steel). The sacrificial layer may be patterned to have at least two opposite sidewalls 506 extending longitudinally over the support substrate thereby forming a substantially rectangular-shaped, recessed region 508.

FIG. 5B schematically depicts a recess filled with an ink composition (or in short an ink). A thick layer of ink may be applied to the surface of the patterned sacrificial layer. Various types of ink as described with reference to FIG. 1B may be used. A doctor blade may be used to sweep over the surface of the patterned sacrificial layer so that the recessed regions may be filled, or at least partially filled, with the ink 510 and excess ink is removed.

FIG. 5C depicts a dried ink structure in the recessed region after evaporation of the solvent in the ink. During evaporating of the solvent in the ink, the volume of the ink decreases.

In one embodiment the sidewalls may be configured to be less hydrophobic than the bottom surface. In that case, during evaporation of the solvent in e.g. a microwave annealing step, the ink will have a tendency to flow towards the sidewalls so that at least a substantial part of the drying ink will be concentrated in the areas along the sidewalls away from the centre of the recess. This way at least part of the centre of the recess will be dewetted and narrow ink filaments along the sidewalls of the indentation may be formed. The dried ink comprising the semiconductor, metal or dielectric precursor may be subsequently processed and transformed into a semiconductor, metal or insulator respectively wherein remnants of materials close to the recess may be removed using a suitable removal step.

In another embodiment, formation of ink filaments along the sidewalls of the indentation as depicted in FIG. 5C may be achieved by exposing an photosensitive, preferably UV sensitive, ink. A photosensitive semiconductor precursor may comprise one or more silane compounds, such as CPS, of the general formula $Si_nX_m$ as described with reference to FIG. 1B. The ink may be exposed with UV light for a predetermined time so that the at least some of the silane compounds are transformed into polysilane chains by photo-polymerization. During this process, the surface energy (or surface tension) of the ink may change (increase), thereby resulting in a change (increase) of the contact angle. This change may result in changes in the dewetting behavior of the ink within the indentation such that ink filaments along the sidewalls of the indentation are formed and such that the centre of the bottom surface of the indentation is dewetted.

The thus formed ink filaments may be transformed in amorphous silicon using a subsequent annealing step, e.g. microwave annealing step as described above, a temperature annealing step up to 350° C. for a period within a range between one and five hours using e.g. a hot plate. In order to reduce the temperature and/or period in the thermal annealing step, a combination of a microwave annealing step and a thermal annealing step may be used.

In one example of experimental results of forming a dried ink patter in a recess region formed by patterning a TEOS on a substrate, an indentation of 5 micron wide, 7 micron long and 250 nm height was formed in a substrate.

The indentation was exposed to an oxidation step by exposing the substrate for 8 minutes to a 500 W oxygen plasma. The plasma modifies (increase) the roughness of surface in the indentation to that an improved adhesion of the amorphous silicon to the substrate is achieved.

The sample was transferred inside a glove box (MBRAUN GmbH Glovebox with Gas purification platform MB20/MB200), which facilitates a substantially oxygen free environment (oxygen level<1 ppm). The indentation was filled with CPS using a doctor-blade coating technique.

After filling the indentation, the substrate was then exposed to UV light (UV AHAND 250GS) for 2 minutes to photopolymerize the CPS. The UV light has a profile of wavelengths ranging from 320 nm to 400 nm with the peak at around 370 nm. During the UV exposure, the remaining CPS in the holes polymerized to higher-order polysilanes and modifying the wetting properties of CPS in the recessed regions causing the dewetting of the central region of surface in the indentation. This way, silane compound ink filaments are formed along the sidewalls of the indentation in a similar way as schematically depicted in FIG. 5C. In this particular example the width of a filament is approximately 700-800 nm and the maximum height of the filament is approximately 250 nm, i.e. similar to the height of the indentation. The width of the filament can be controlled by controlling the UV exposure time, substrate temperature, surface treatment and selection of the materials for the sidewalls and the bottom surface of the indentation. Remnants of silane compounds in the dewetted regions are visible and can be removed using a short HF etch after material has been transformed into (poly) crystalline silicon.

Hence, on the basis of the process depicted in FIG. 5A-5D, a thin-film structure with reduced nano-scale dimensions (i.e. a dimension w' smaller than the width of the recess) may be formed in the recess. The process results in a first narrowed, thin-film structure inside the recess, so that the recess can serve as a template in the formation of a further second thin-film structure, which may be accurately aligned with respect to first thin-film structure. This way, both small feature sizes, preferably submicron feature sizes within a range between 20 and 400 nm, preferably between 40 and 200 nm, and high alignment accuracy can be achieved. Although FIG. 5C depicts the formation of a longitudinal structure, it is clear for a skilled person that the invention allows formation of may shapes of ink filaments, e.g. (partly) rectangular, circular, triangular or combinations thereof. As described hereunder in more detail with reference to FIGS. 6 and 7, these ink filaments may be used in the manufacture of self-aligned TFT structures in an indentation.

FIG. 6 depicts a schematic of a process for the manufacture of a thin-film structure according to an embodiment of the invention. In this particular embodiment, the semiconductor thin-film structure may be part of staggered top gate thin-film transistor.

Figure 6B:
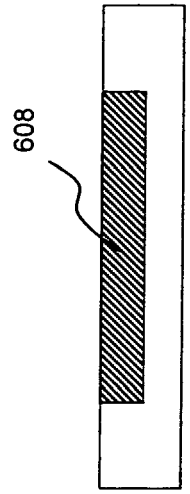
FIG. 6A-6G schematically depicts a process for the manufacture of at least part of a semiconducting device according to an embodiment of the invention.
Figure 6D:
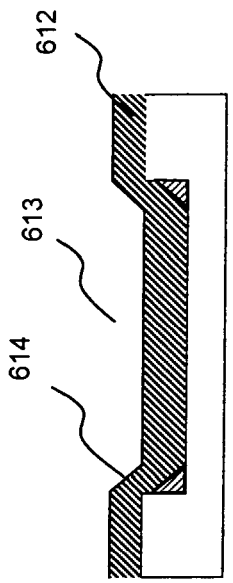
Figure 6F:
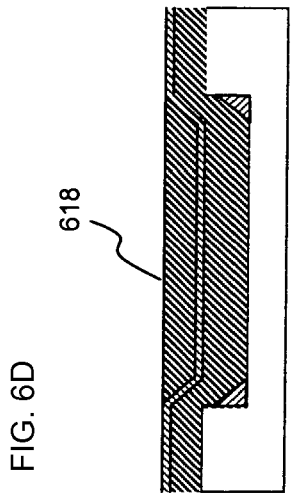
Figure 6A:
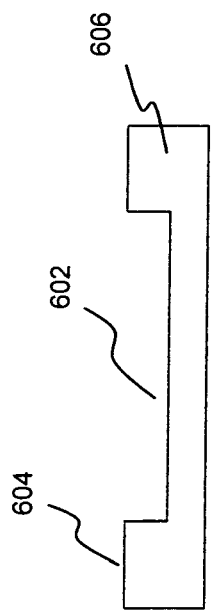

FIG. 6A depicts the start of the process wherein a first (support) substrate is provided and one or more indentations (recesses) 602, each comprising sidewalls and a base (bottom surface), are formed in the top surface 604 of the first substrate 606. In one embodiment, the one or more indentations may be formed such that the sidewalls of the indentations are more hydrophobic than the bottom surface of the indentation in a similar way as described with reference to FIGS. 5A and 5B.

FIG. 6B depicts an indentation filled with a first liquid material 608, preferably a first semiconducting material, e.g. a semiconducting ink composition comprising a semiconductor precursor and an (organic) solvent as described with reference to FIG. 5B. In one embodiment, the semiconducting ink composition may comprise a silane compound represented by the general formula $Si_nX_m$.

In an embodiment (not shown), a known slit coating technique (doctor blade) may be used for filling the indentation wherein the first liquid semiconducting material, a first semiconducting ink, is provided on the substrate comprising the indentations. In another embodiment, an ink-jet printing method may be used in order to fill the indentation.

Figure 6C:
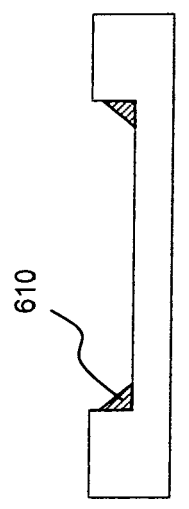

Thereafter, the solvent in the ink may be evaporated so that the total volume of the ink composition in the indentation is reduced. In one embodiment, the sidewalls are made to be less hydrophobic that the bottom surface of the indentation, so that the drying ink is concentrated along the sidewalls while the centre surface of the indentation is dewetted. This way a narrowed first thin-film structure 610, i.e. two narrow ink filaments along the sidewalls of the indentation, is formed in the indentation as depicted in FIG. 6C. The material of the first thin-film structure may be transformed into a solid-state semiconducting material using a suitable transformation process.

In one embodiment, the semiconducting ink may comprise a silane compound represented by the general formula $Si_nX_m$. In that case, in one embodiment, the evaporation of the solvent, the formation of ink filaments and the transformation of the silane compound into amorphous silicon may be achieved in a microwave-annealing step in a similar way as described with reference to FIG. 2C. The microwave-annealing step will heat up the ink composition so that the solvent is evaporated, narrow ink filaments are formed along the sidewalls of the indentation and the centre of the bottom surface of the indentation is dewetted. Remnants of silicon at the centre surface may be removed using a suitable removal step, e.g. a short HF etch (an HF dip). Such HF etch may also be used to further reduce the dimensions of the thin-film filaments. Optionally, the amorphous silicon may be transformed into (poly)crystalline silicon using a (pulsed) laser anneal In another embodiment, the semiconducting ink is a UV sensitive semiconducting ink comprising e.g. one or more silane compounds, such as CPS, of the general formula $Si_nX_m$. As already explained in detail with reference to FIGS. 5C and 5D, exposure of the UV sensitive semiconducting ink may result in ink filaments concentrated along the sidewalls of the indentation and dewetting of the centre of the bottom surface of the indentation.

The silane compound material of the ink filaments may be transformed into amorphous silicon using a suitable annealing step, e.g. microwave annealing step as described above, a thermal annealing step up to 350° C. for a period within a range between one and five hours using e.g. a hot plate. In order to reduce the temperature and/or period in the thermal annealing step, a combination of a microwave annealing step and a thermal annealing step may be used.

The thus formed first thin-film structure in the indentation may be used as a template for a next thin-film processing step. In one embodiment, before starting the formation of a further semiconducting layer on the basis of a second liquid semiconducting material, the surface of the substrate comprising the indentations may be exposed to a surface and/or temperature treatment in order to increase surface wetting so that coverage of the second liquid semiconducting material is achieved. Alternatively and/or in addition, a surfactant may be added to the second liquid semiconducting material in order to increase the wetting across the substrate surface.

FIG. 6D depicts the formation of a layer 612 of a second liquid semiconducting material across the indentation. The second liquid semiconducting material, a second semiconducting ink, may comprise a silane compound represented by the general formula $Si_nX_m$ as described with reference to FIG. 1B. In order to achieve uniform coverage, the ink may be sprayed onto the substrate.

After formation of the layer, the evaporation of the solvent and the transformation of the silane compound into (poly) crystalline silicon may be achieved in a microwave-annealing step and a subsequent (pulsed) laser annealing step in a similar way as described with reference to FIG. 2C. This way, a first staggered thin-film semiconductor ((poly) crystalline) layer 612, may be formed across the indentation.

The silicon filaments 610 along the sidewalls of the indentation may act as spacers such that a continuous (poly) crystalline layer may be established across the indentation. The spacers allow the formation of a continuous (poly) crystalline connection 614 between a first part of the first thin-film layer on top of the surface of the substrate and a second part of the first thin-film layer at the base of indentation.

The first thin-film layer may follow the staggered topology of the indentation comprising the silicon filaments. Hence, after the formation of the first thin-film layer, the indentation 613 in the substrate is still present and may be used as a template in the formation of a further, self-aligned second thin-film structure. In this particular embodiment, the sidewalls of the indentation may form an angle with the substrate surface, wherein the angle is determined by the (poly)silicon filaments.

Figure 6E:
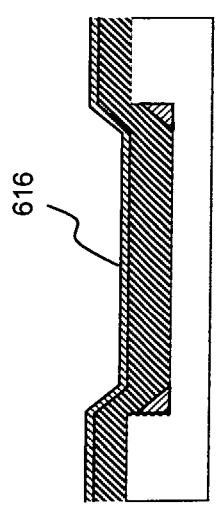
Figure 6G:
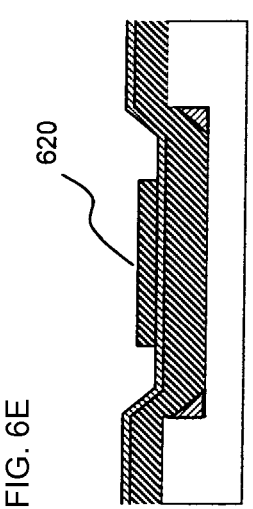

FIG. 6E depicts the formation of an insulting layer over the first thin-film layer by oxidizing the its surface using e.g. an O2 plasma exposure thereby forming an $SiO_2$ insulating layer 616 over the first thin-film layer FIG. 6F depicts the filling of the indentation with a further, third liquid semiconducting material 618, a third semiconducting ink comprising e.g. one or more silane compounds for forming a second semiconductor layer 620, in particular a (poly) crystalline silicon layer, in the indentation on the oxidized first (poly)crystalline layer 612, wherein the second (poly) crystalline silicon layer is in alignment with the underlying first (poly)crystalline layer. The second semiconductor layer may formed using in similar process steps as described with reference to FIGS. 3E and 3F.

Hence, process depicted in FIG. 6A-6F illustrates—in short—a process for forming a semiconductor structure, comprising the steps of:
providing a substrate, preferably a plastic substrate;
providing an indentation in the substrate, preferably said indentation comprising sidewalls and a base;
filling the indentation with a first ink comprising a first material, preferably said first material comprising a (doped) silane compound, and optionally a solvent;
annealing at least a portion of said first ink, wherein during said annealing said first material accumulates at edges of the bottom surface of the indentation to form first structures (filaments) while the centre part of the base surface in said indentation is dewetted;
providing a first layer of a second ink comprising a second material over said substrate and said indentation;
annealing at least a portion of the second ink so as to form a first staggered thin-film layer across said indentation comprising said second material;
providing a insulating layer over said first staggered thin-film layer;
filling said indentation with a third ink comprising a third material;
annealing at least a portion of the third ink so as to form a second structure within said indentation comprising said second material.

The structure produced by this process may be used as a staggered self-aligned TFT structure wherein first staggered thin-film layer may act as the channel layer of a TFT and wherein the second structure may act as the gate of the TFT.

FIG. 7 depicts a schematic of a process for the manufacture of a thin-film structure according to an embodiment of the invention. In this particular embodiment, the semiconductor thin-film structure may be part of a staggered top gate thin film transistor on top of a transparent flexible substrate.

FIG. 7A-7E depict a process for the formation of a staggered oxidized first semiconductor layer 712 formed across an indentation 702, which is formed in the top surface 704 of the first substrate 706. In this particular embodiment, the substrate material in an (UV) transparent material e.g. (UV) transparent glass or plastic. The indentation may comprise sidewalls, a base (bottom surface) and metallic filaments (spacers) 710 formed along the sidewalls of the indentation, which may act as spacers for the first semiconducting layer. The metallic spacers allow the formation of a continuous (poly)crystalline connection 714 between a first part of the first thin-film layer on top of the surface of the substrate and a second part of the first thin-film layer at the base of indentation. The metallic filaments and the staggered oxidized first semiconductor layer 712 formed across the indentation may be fabricated using similar processing steps as described with reference to FIG. 6A-6E wherein the metallic spacers is fabricated thermally annealing an ink comprising a metal precursor or an ink comprising metallic nanoparticles.

After the formation of the staggered first thin-film layer, an indentation 713 in the substrate is still present, which may be used as a template for the formation of a further, self-aligned second thin-film structure.

In one embodiment, before filling the indentation, the surface of staggered thin-film layer may be exposed to a surface and/or temperature treatment in order to increase the wetting and adhesion, so that coverage by a second liquid material is achieved. Alternatively and/or in addition, a surfactant may be added to the second liquid semiconducting material in order to further increase the wetting properties.

FIG. 7F depicts the formation of a layer of a second liquid semiconducting material 718. The second liquid semiconducting material, a second semiconducting ink, may comprise a silane compound represented by the general formula $Si_nX_m$ as described with reference to FIG. 1B. In order to achieve uniform coverage, the ink may be sprayed onto the substrate.

After formation of the layer, the silane compound in the layer may be transformed into (poly)crystalline silicon using a microwave-annealing step and a subsequent (pulsed) laser annealing step in a similar way as described with reference to FIG. 2C. This way, a second staggered thin-film semiconductor ((poly)crystalline) layer 718 may be formed across the indentation. The first and second staggered thin film semiconducting layer may form a staggered thin-film stack which may be used in the formation of a staggered TFT structure.

FIG. 7G depicts formation of a negative photo-resist layer 720 on top of the staggered thin-film structure using e.g. slit-coating. Thereafter, the backside of the UV transparent substrate may be exposed to UV light 722 whereby the metallic filaments 710 will shield parts of the photoresist layer from being exposed to UV. Parts of the photoresist layer that that are not shielded by the metallic filaments will be polymerised so that the non-polymerized parts in the resist layer may be removed by a standard developing step. This way openings 723 in the resist layer may be realized at the positions where the metallic filaments are located.

The openings may be used as an etching mask in a chemical etching step wherein parts 724 of the second staggered semiconductor layer are removed thereby forming a thin-film semiconductor structure 726 positioned within the indentation and isolated from second and third parts of the second layer are positioned outside the indentation.

Hence, in this embodiment, a staggered stack of thin-film semiconductor films/structures may be formed in a self-aligned manner wherein metallic filaments formed by evaporating an metal ink are used in order to selectively expose a photoresist in a self-aligned manner.

The staggered thin-film stack may comprise a (top) gate layer 726 which is aligned with a ((poly)crystalline) channel layer 728 and thus can be used as a base structure for forming TFTs on a flexible substrate.

In a further embodiment, the first staggered thin-film may comprise a transparent semiconductor. Such transparent semiconductor thin-film may be formed using e.g. a solvent comprising InGaZnO nanoparticles. The transparent semiconductor thin-film may be covered with an insulating layer using a suitable dielectric precursor for forming e.g. an silicon dioxide layer. Further, the second staggered thin-film may comprise a transparent conduction material such as Indium Tin oxide (ITO). Such film may be formed on the basis of an ink comprising a metal-oxide precursor. When using such transparent materials, transparent flexible electronic components on flexible substrates can be made.

Hence, process depicted in FIG. 7A-7H illustrates—in short—a process for forming a semiconductor structure, comprising the steps of:
providing a substrate comprising a top side and a backside, preferably comprising a (UV) transparent material;
providing an indentation in the substrate, preferably said indentation comprising sidewalls and a base;
filling the indentation with a first ink comprising a first material, preferably said first material comprising a metallic nanoparticles, a metal precursor, a (doped) silane compound and, optionally a solvent;
evaporating at least a portion of said first ink, wherein during the evaporation of said first ink, said first material accumulates at edges of the bottom surface of the indentation to form first structures (filaments) while the centre part of the base surface in said indentation is dewetted;
providing a first layer of a second ink comprising a second material over said substrate and said indentation, preferably said second material comprising a transparent semiconductor or a compound thereof;
annealing at least a portion of the second ink so as to form a first staggered thin-film layer comprising said second material;
providing a insulating layer on top of said first staggered thin-film layer;
providing a second layer of a third ink comprising a third material over said substrate and said indentation, preferably said third material comprising a transparent conductive material;
annealing at least a portion of the third ink so as to form a second staggered thin-film layer comprising said third material;
depositing a negative photoresist layer over said second thin-film layer;
exposing the backside of said substrate with UV light such that said first structures shield the photoresist layer from exposure to said UV light;
developing said photoresist layer in order to open parts in said photoresist layer which are in alignment with said first structures, said opened parts exposing said second thin-film layer;
removing parts of in said second thin-film layer using a etch process thereby forming a second structure in said indentation.

The structure produced by this process may be used as a staggered self-aligned TFT structure wherein first thin-film layer may act as the channel layer of a TFT and wherein the second structure may act as the gate of the TFT.

It is to be understood that any feature described in relation to any one embodiment may be used alone, or in combination with other features described, and may also be used in combination with one or more features of any other of the embodiments, or any combination of any other of the embodiments. For example, while the embodiment in FIG. 1-7 are generally described in relation to the formation of thin-film stacks that are suitable for use in self-aligned TFT structures, it clear for a skilled person that on the basis of the wetting behaviour of ink in indentations in a substrate many other self-aligned structures including thin-film multilayer structure comprising combinations of metallic, insulating and/or semiconducting thin-film layers. Moreover, the invention is not limited to electronic (TFT) structures but may also be used in the formation of self-aligned optoelectronic structures and photovoltaic structures.

Moreover, the invention is not limited to the embodiments described above, which may be varied within the scope of the accompanying claims.

The invention claimed is:

1. A method for the manufacture of at least part of a thin-film device, said method comprising:
forming one or more indentations in a substrate, an indentation comprising sidewalls and a base;
filling at least one of said one or more indentations with a first ink, said first ink comprising a first material precursor; and
annealing at least a portion of said first ink such that a surface of said base inside the indentation is dewetted and a narrowed first structure of the first material inside of the indentation is formed:
wherein said sidewalls are configured to have a lower affinity for said ink than said surface of said base; or wherein said surface of said base is configured to have a lower affinity for said ink than said sidewalls.

2. The method according to claim 1 wherein said affinity for said ink is controlled by at least one of:
selection of the materials of the sidewall and the base;
a surface treatment of said sidewalls and said base;
adding a predetermined surfactant to the ink for modifying its wetting properties;
adding a predetermined solvent to the ink for modifying its wetting properties; or
irradiating said ink with UV radiation.

3. The method according to claim 2 wherein said surface treatment is a plasma treatment.

4. The method according to claim 1 wherein said annealing comprises:
transforming said material precursor in said ink into an amorphous semiconducting material by one or both of:
exposing said ink to microwaves, the microwave power being between 100 W and 10 kW and the microwave frequency being between 300 MHz and 300 Ghz; or
exposing said ink to a thermal annealing step, wherein said ink is exposed to a temperature between 50 and 350° C.

5. The method according to claim 4 wherein said annealing further comprises:
exposing said amorphous semiconducting material to a laser in order to transform at least part of said amorphous semiconducting material into a crystalline semiconducting material.

6. The method according to claim 4 wherein said inorganic material is an amorphous semiconducting material.

7. The method according to claim 1 wherein said material precursor comprises a semiconductor precursor comprising one or more silane compounds represented by the general formula $Si_nX_m$, wherein X is a hydrogen; n is an integer of 5 or greater; and m is an integer defined as n, 2n-2, 2n or 2n+1.

8. The method according to claim 7 wherein said annealing comprises:
exposing said ink in said one or more indentations to UV radiation for a predetermined time such that at least part of said base surface within said indentation is dewetted.

9. The method according to claim 7 wherein n is an integer between 5 and 20.

10. The method according to claim 1 wherein the height of said one or more indentations is between 10 nm and 5000 nm.

11. The method according to claim 1 wherein during said annealing of at least a portion of said first ink, said first material precursor accumulates at the edges of the bottom surface of the indentation to form first structures (filaments) while the centre part of the base surface in said indentation is dewetted, said method further comprising:
transforming said first structures (filaments) into a first solid-state, crystalline material.

12. The method according to claim 11 further comprising:
applying a second ink, said second ink comprising a second material precursor, over said substrate and at least one of said indentations comprising said first structures; and
forming a staggered first thin-film across said indentation by transforming said second material precursor into a second solid-state crystalline material.

13. The method according to claim 12 further comprising:
forming an oxide layer over said staggered first thin-film;
filling said indentation comprising said first structure and at least part of said staggered first thin-film with a third ink, said third ink comprising a third material precursor; and
annealing at least a portion of said third ink such that a second structure comprising a third material precursor is formed inside said indentation.

14. The method according to claim 13 wherein said first, second, and third material precursors comprise metal-, semiconductor-, or metal-oxide precursors; and
wherein said first and second solid-state, crystalline materials comprise crystalline semiconductor materials.

15. The method according to claim 11 wherein said substrate is a transparent substrate and wherein said first structures (filaments) are used as a mask for selectively exposing a resist on top of said substrate when the backside of said substrate is exposed to UV radiation.

16. The method according to claim 1 wherein during said annealing at least a portion of said first ink, said first material precursor accumulates at the centre of the base surface of the indentation to form first structures while areas along the sidewalls of said indentation are dewetted, said method further comprising:
transforming said first structures into a solid-state, crystalline material;
forming an oxide layer over said first structure;
filling said indentation comprising said first structure with a second ink, said second ink comprising a second material precursor, said second material precursor comprising a metal-, semiconductor-, or a metal-oxide precursor;
annealing at least a portion of said second ink such that a second structure comprising said second material precursor is formed inside the indentation over said first structure.

17. The method according to claim 1 wherein said at least one of said one or more indentations is used as a template in the formation of a second structure which is in alignment with said first structure.

18. The method according to claim 1 wherein said substrate is a flexible substrate.

19. The method according to claim 18 wherein said substrate is a plastic substrate or a metal substrate.

20. The method according to claim 1 wherein said one or more indentations have a width between 40 nm and 5000 nm.

* * * * *